(12) United States Patent
Nakamura et al.

(10) Patent No.: US 7,670,873 B2
(45) Date of Patent: Mar. 2, 2010

(54) METHOD OF FLIP-CHIP MOUNTING

(75) Inventors: Kimio Nakamura, Kawasaki (JP); Kenji Kobae, Kawasaki (JP); Takashi Kubota, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 286 days.

(21) Appl. No.: 11/435,851

(22) Filed: May 18, 2006

(65) Prior Publication Data
US 2007/0184582 A1 Aug. 9, 2007

(30) Foreign Application Priority Data
Feb. 8, 2006 (JP) .............................. 2006-031652

(51) Int. Cl.
*H01L 21/00* (2006.01)
*H01L 21/44* (2006.01)

(52) U.S. Cl. ...................... 438/106; 438/107; 438/108; 438/109; 257/E21.503

(58) Field of Classification Search ....................... None
See application file for complete search history.

(56) References Cited

U.S. PATENT DOCUMENTS

| 4,681,654 | A | * | 7/1987 | Clementi et al. | ............... 216/18 |
| 6,482,673 | B2 | * | 11/2002 | Hashimoto | ................... 438/106 |
| 6,544,818 | B2 | * | 4/2003 | Yagi et al. | ................... 438/118 |

FOREIGN PATENT DOCUMENTS

| JP | 57-176738 | 10/1982 |
| JP | 2-246236 | 10/1990 |
| JP | 11-204571 | 7/1999 |
| JP | 11-274378 | 10/1999 |
| JP | 2000-138253 | 5/2000 |
| JP | 2000-299330 | 10/2000 |
| JP | 2000-323523 | 11/2000 |
| JP | 2004221319 A | * 8/2004 |

OTHER PUBLICATIONS

English machine translation of Japanese patent application publication No. JP 2004221319.*

* cited by examiner

*Primary Examiner*—Charles D Garber
*Assistant Examiner*—Pape Sene
(74) *Attorney, Agent, or Firm*—Kratz, Quintos & Hanson, LLP

(57) ABSTRACT

A method of flip-chip mounting can reliably and stably mount a semiconductor chip to a mounting substrate while avoiding problems such as damage to the semiconductor chip due to a difference in thermal expansion coefficients between the semiconductor chip and the mounting substrate. The method of flip-chip mounting a semiconductor chip supports a mounting substrate on a stage in a state where a resin material has been supplied onto a chip mounting surface of the mounting substrate and presses the semiconductor chip toward the mounting substrate using a pressure/heat applying head to bond the semiconductor chip to the mounting substrate and thermally harden the resin material. A concave part is provided in a support surface of the stage that supports the semiconductor chip, and the semiconductor chip is bonded to the mounting substrate by pressing the semiconductor chip toward the mounting substrate using the pressure/heat applying head in a state where the mounting substrate is bent toward the concave part.

1 Claim, 2 Drawing Sheets

METHOD OF FLIP-CHIP MOUNTING

BACKGROUND OF THE INVENTION

1. Field of the Invention

The present invention relates to a method of flip-chip mounting and in more detail to a method of flip-chip mounting that can avoid the problem of a semiconductor chip being damaged during bonding due to differences in thermal expansion coefficients between the semiconductor chip and a mounting substrate.

2. Related Art

Among methods of mounting a semiconductor chip on a mounting substrate as a flip-chip, as shown in FIG. 5A, there is a method that connects a semiconductor chip 14 as a flip-chip after applying a resin material 12 in advance onto a semiconductor chip mounting region of a mounting substrate 10. FIG. 5B shows a state where the semiconductor chip 14 is supported by a pressure/heat applying head 20, is positioned with respect to the mounting substrate 10, and is mounted on the mounting substrate 10 while pressure and heat are applied to the semiconductor chip 14.

When the resin material 12 is supplied onto the mounting substrate 10 in advance and the semiconductor chip 14 is connected as a flip-chip, as shown in FIG. 5B, the mounting substrate 10 is supported on a stage 22 that has been heated to around 70 to 80° C., and mounting is carried out after the pressure/heat applying head 20 has been heated to the thermal hardening temperature or higher of the resin material 12 (around 200° C., for example). By merely heating the semiconductor chip 14 for around five seconds using the pressure/heat applying head 20, bumps 14a of the semiconductor chip 14 are electrically connected to connection pads formed on the mounting substrate 10 and the resin material 12 that fills the gap between the semiconductor chip 14 and the mounting substrate 10 is thermally hardened.

Patent Document 1
  Japanese Laid-Open Patent Publication No. 2000-138253

Patent Document 2
  Japanese Laid-Open Patent Publication No. S57-176738

Patent Document 3
  Japanese Laid-Open Patent Publication No. 2000-299330

Patent Document 4
  Japanese Laid-Open Patent Publication No. 2000-323523

However, since the thermal expansion coefficients of the semiconductor chip 14 and the mounting substrate 10 that is made of resin differ by a factor of around three, when the semiconductor chip 14 is flip-chip mounted, due to the large difference in thermal expansion between the semiconductor chip 14 and the mounting substrate 10, after mounting, as shown in FIG. 6, the mounting substrate 10 becomes warped toward the semiconductor chip 14.

If mounting is carried out with the mounting substrate 10 in a warped state and the gap between the surfaces of the mounting substrate 10 and the semiconductor chip 14 becomes narrow in a central part of the chip mounting surface of the mounting substrate 10, filler such as alumina or silica added to the resin material 12 to make the thermal expansion coefficient match that of the semiconductor chip 14 is compressed by the mounting substrate 10 and the semiconductor chip 14, resulting in the problem of damage to the circuit surface of the semiconductor chip 14 and in wiring formed on the circuit surface becoming disconnected.

When the bumps 14a are formed on the semiconductor chip 14 at wide intervals, it is possible to form large, high bumps 14a, and therefore even if the mounting substrate 10 becomes warped during flip-chip bonding, the problem of the semiconductor chip 14 being damaged hardly occurs. However, with a product where the bumps 14a are disposed with a high density, the bumps 14a themselves become small and the height of the bumps 14a becomes lower (around 15 μm), and therefore there is the problem that the semiconductor chip 14 can be damaged even if the mounting substrate 10 only becomes slightly warped.

SUMMARY OF THE INVENTION

The present invention was conceived to solve the problems described above, and it is an object of the present invention to provide a method of flip-chip mounting that can reliably and stably mount a semiconductor chip while avoiding problems such as damage to the semiconductor chip due to a difference in thermal expansion coefficients between the semiconductor chip and a mounting substrate when connecting the semiconductor chip as a flip-chip to the mounting substrate.

To achieve the stated object, a method of flip-chip mounting a semiconductor chip according to the present invention supports a mounting substrate on a stage in a state where a resin material has been supplied onto a chip mounting surface of the mounting substrate and presses the semiconductor chip toward the mounting substrate using a pressure/heat applying head to bond the semiconductor chip to the mounting substrate and thermally harden the resin material, wherein a concave part is formed in a support surface of the stage that supports the semiconductor chip, and the semiconductor chip is bonded to the mounting substrate by pressing the semiconductor chip toward the mounting substrate using the pressure/heat applying head in a state where the mounting substrate is bent toward the concave part.

A suction hole that is in communication with a base surface of the concave part may be provided in the stage, and when the semiconductor chip is bonded to the mounting substrate by the pressure/heat applying head, bonding may be carried out in a state where the mounting substrate is pulled by suction from the suction hole to forcibly bend the mounting substrate toward the concave part.

Another method of flip-chip mounting a semiconductor chip supports a mounting substrate on a stage in a state where a resin material has been supplied onto a chip mounting surface of the mounting substrate and presses the semiconductor chip toward the mounting substrate using a pressure/heat applying head to bond the semiconductor chip to the mounting substrate and thermally harden the resin material, wherein a surface of the pressure/heat applying head on which the semiconductor chip is held by suction is formed as a concave surface, a suction hole that is in communication with the concave surface is provided, and when the semiconductor chip is bonded to the mounting substrate by the pressure/heat applying head, the semiconductor chip is pulled by suction from the suction hole to forcibly bend the semiconductor chip toward the concave surface.

Yet another method of flip-chip mounting a semiconductor chip supports a mounting substrate on a stage in a state where a resin material has been supplied onto a chip mounting surface of the mounting substrate and presses the semiconductor chip toward the mounting substrate using a pressure/heat applying head to bond the semiconductor chip to the mounting substrate and thermally harden the resin material, wherein a spacer that supports the semiconductor chip at a distance from the mounting substrate is provided on the mounting substrate, and the mounting substrate and the semiconductor chip are bonded together so that the mounting substrate and the semiconductor chip are electrically connected and the mounting substrate and the semiconductor chip are separated by the spacer.

Yet another method of flip-chip mounting a semiconductor chip supports a mounting substrate on a stage in a state where a resin material has been supplied onto a chip mounting surface of the mounting substrate and presses the semiconductor chip toward the mounting substrate using a pressure/heat applying head to bond the semiconductor chip to the mounting substrate and thermally harden the resin material, wherein a spacer that supports the semiconductor chip at a distance from the mounting substrate is provided on a bonding surface of the semiconductor chip, and the mounting substrate and the semiconductor chip are bonded together so that the mounting substrate and the semiconductor chip are electrically connected and the mounting substrate and the semiconductor chip are separated by the spacer.

According to the method of flip-chip mounting according to the present invention, it is possible to flip-chip mount a semiconductor chip while solving the problem of a mounting substrate becoming bent during mounting due to a difference in thermal expansion coefficients between the semiconductor chip and the mounting substrate resulting in the semiconductor chip becoming damaged by filler included in a resin material, and therefore a drop in quality can be prevented.

BRIEF DESCRIPTION OF THE DRAWINGS

The aforementioned and other objects and advantages of the present invention will become apparent to those skilled in the art upon reading and understanding the following detailed description with reference to the accompanying drawings.

In the drawings.

DESCRIPTION OF THE PREFERRED EMBODIMENTS

First Embodiment

Figure 1:
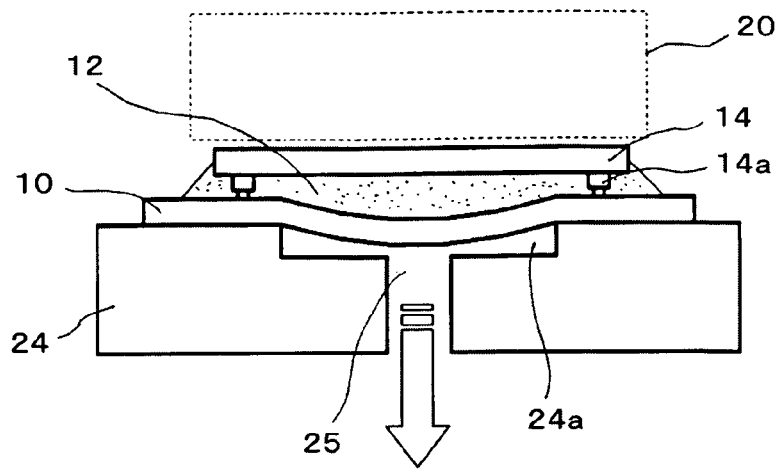
FIG. 1 is a diagram useful in explaining a first embodiment of a method of flip-chip mounting according to the present invention.

FIG. 1 shows a first embodiment of a method of flip-chip mounting according to the present invention. In the present embodiment, the resin material 12 is applied in advance onto a chip mounting surface of the mounting substrate 10 and the semiconductor chip 14 is positioned relative to and mounted upon the mounting substrate 10 while being held by suction on the pressure/heat applying head 20.

In the present embodiment, a concave part 24a is formed on a support surface of a stage 24 that supports the mounting substrate 10, a suction hole 25 that is in communication with an inner base surface of the concave part 24a is provided in the stage 24, and the suction hole 25 is connected to a vacuum suction apparatus (not shown). The concave part 24a is formed in a region that is within a region where the bumps 14a are formed on the semiconductor chip 14.

In the present embodiment, after the mounting substrate 10 has been set on the stage 24 and the resin material 12 has been supplied onto the chip mounting surface of the mounting substrate 10, the vacuum suction apparatus is operated to pull the mounting substrate 10 by suction via the suction hole 25 and the semiconductor chip 14 held by suction on the pressure/heat applying head 20 is flip-chip mounted in a state where the mounting substrate 10 is downwardly convex, i.e., a state where a central part of the mounting substrate 10 is bent downward away from the semiconductor chip 14.

The pressure/heat applying head 20 is heated to around 200° C. The semiconductor chip 14 is held by suction on the pressure/heat applying head 20 and is pressed toward the mounting substrate 10 so that the bumps 14a of the semiconductor chip 14 are bonded to connection terminals provided on the mounting substrate 10 by soldering or the like. The resin material 12 held between the semiconductor chip 14 and the mounting substrate 10 fills the gap between the semiconductor chip 14 and the mounting substrate 10 and is thermally hardened. Since the stage 24 is formed as a flat surface at positions where the bumps 14a of the semiconductor chip 14 are formed, the pressing force acts reliably on the mounting substrate 10 and the semiconductor chip 14 so that electrical connections can be reliably produced between the bumps 14a and the connection terminals of the mounting substrate 10.

The resin material 12 seals and protects the bonded parts of the semiconductor chip 14 and the mounting substrate 10 from the outside. When the semiconductor chip 14 heats up and thermal stress acts between the semiconductor chip 14 and the mounting substrate 10, the resin material 12 also acts so as to firmly hold the semiconductor chip 14 and the mounting substrate 10 together so that the electrical connections between the bumps 14a and the connection terminals do not become unreliable.

In the method of flip-chip mounting according to the present embodiment, when the mounting substrate 10 is supported on the stage 22, mounting is carried out with the mounting substrate 10 forcibly bent so as to be downwardly convex. By doing so, after mounting, even if the mounting substrate 10 deforms so as to become bent toward the semiconductor chip 14, the gap between the mounting substrate 10 and the circuit surface of the semiconductor chip 14 is prevented from becoming excessively narrow. By keeping the gap between the semiconductor chip 14 and the chip mounting surface of the mounting substrate 10 at a predetermined distance or above, it is possible to avoid the problem of the circuit surface of the semiconductor chip 14 being damaged by the filler included in the resin material 12 after mounting.

In a method of flip-chip mounting that forcibly bends the mounting substrate 10 by pulling the mounting substrate 10 by suction from the concave part 24a side of the stage 24, by controlling the vacuum suction force, the amount by which the mounting substrate 10 bends can be adjusted, and therefore it is possible to control the gap between the mounting substrate 10 and the semiconductor chip 14 after mounting in accordance with the product. It is effective to adjust the amount by which the mounting substrate 10 bends since the size, thickness, and material of the mounting substrate 10 differ from product to product.

Note that in the method of flip-chip mounting where the concave part 24a is provided in the stage 24, it is also possible to mount the semiconductor chip 14 as a flip-chip with the mounting substrate 10 set on the stage 24 but without pulling the mounting substrate 10 by suction from the suction hole 25 to forcibly bend the mounting substrate 10.

That is, after the resin material 12 has been supplied onto the mounting substrate 10, when the semiconductor chip 14 held by suction on the pressure/heat applying head 20 is pressed toward the mounting substrate 10, the mounting substrate 10 bends toward the concave part 24a via the resin material 12. This method is effective in cases where the semiconductor chip 14 will not be damaged by the filler included in the resin material 12 even if the mounting substrate 10 is not greatly bent during flip-chip mounting, since the construction of the apparatus can be simplified.

Second Embodiment

Figure 2:
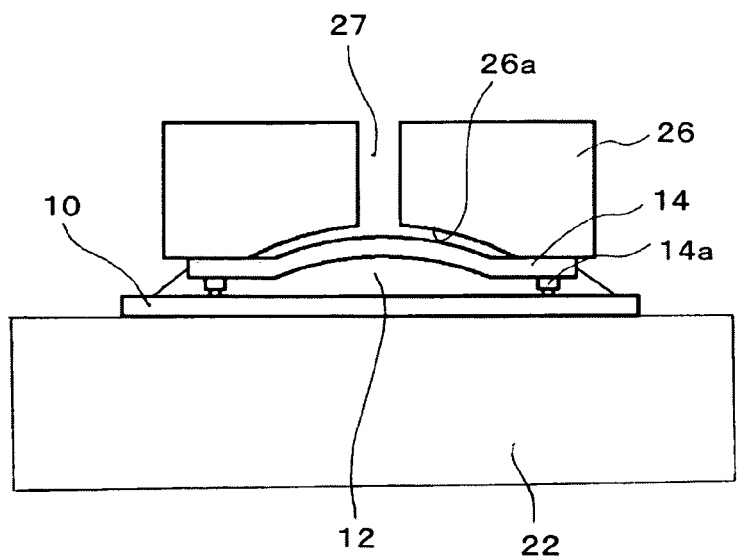
FIG. 2 is a diagram useful in explaining a second embodiment of a method of flip-chip mounting according to the present invention.

FIG. 2 shows a second embodiment of a method of flip-chip mounting according to the present invention. The method of flip-chip mounting according to the present embodiment is characterized by using a stage 22 where the support surface that supports the mounting substrate 10 is formed as a flat surface and using a pressure/heat applying head 26 where a concave surface 26a that allows the semiconductor chip 14 to bend away from the chip mounting surface of the mounting substrate 10 is provided on a surface on which the semiconductor chip 14 is held and a suction hole 27 is provided so as to be in communication with a center position of the concave surface 26a. The suction hole 27 is also in communication with a vacuum suction apparatus (not shown).

FIG. 2 shows a state where, after the mounting substrate 10 has been set on the stage 22 and the resin material 12 has been supplied onto the chip mounting surface of the mounting substrate 10, the semiconductor chip 14 is held by suction on the pressure/heat applying head 26, and the semiconductor chip 14 is heated while being pressed onto the mounting substrate 10 so as to be flip-chip mounted. By pulling the semiconductor chip 14 by suction from the suction hole 27 provided in the pressure/heat applying head 26, the semiconductor chip 14 is flip-chip mounted in a state where the semiconductor chip 14 is upwardly convex as shown in FIG. 2, i.e., where a central part of the semiconductor chip 14 is bent in a direction away from the mounting substrate 10.

The resin material 12 held between the mounting substrate 10 and the semiconductor chip 14 is heated by the pressure/heat applying head 26, fills the gap between the semiconductor chip 14 and the mounting substrate 10, and thermally hardens.

In the method of flip-chip mounting according to the present embodiment, since the semiconductor chip 14 is mounted in a state where the semiconductor chip 14 is bent so as to be upwardly convex, it is possible to mount the semiconductor chip 14 while preventing the gap between the semiconductor chip 14 and the mounting substrate 10 from becoming excessively narrow after mounting. By doing so, it is possible to avoid the problem of the circuit surface of the semiconductor chip 14 becoming damaged by the filler included in the resin material 12. Note that the filler included in the resin material 12 is mixed in so as to constitute around 30 to 40% by weight, and therefore is a large proportion of the resin material 12.

When air is evacuated to pull the semiconductor chip 14 from the suction hole 27 provided in the pressure/heat applying head 26, by controlling the vacuum suction force of the vacuum suction apparatus, mounting can be carried out with the amount of bending of the semiconductor chip 14 being suitably controlled. In the same way as when mounting is carried out with the mounting substrate 10 in a bent state in the first embodiment, when mounting is carried out with the semiconductor chip 14 in a bent state, by slightly bending the semiconductor chip 14 by only a slight amount, it is possible to control the gap between the semiconductor chip 14 and the chip mounting surface of the mounting substrate 10 to an extent where the circuit surface of the semiconductor chip 14 is not damaged.

Third Embodiment

Figure 3:
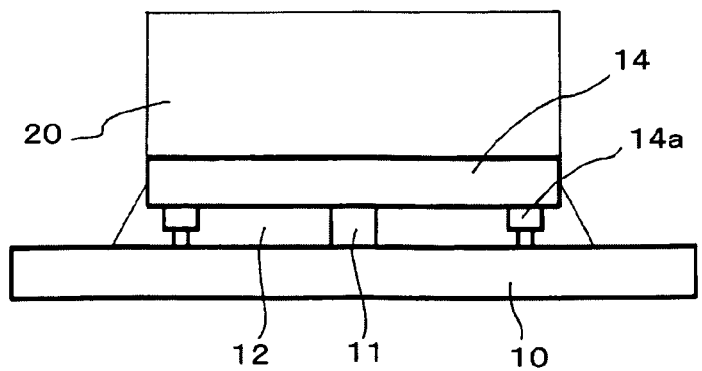
FIG. 3 is a diagram useful in explaining a third embodiment of a method of flip-chip mounting according to the present invention.

FIG. 3 shows a third embodiment of a method of flip-chip mounting according to the present invention. The method of flip-chip mounting according to the present embodiment is characterized by providing a spacer 11, which supports the semiconductor chip 14 at a distance from the mounting substrate 10, in advance on a chip mounting surface of the mounting substrate 10 and mounting the semiconductor chip 14 with the spacer 11 between the mounting substrate 10 and the semiconductor chip 14.

As shown in FIG. 3, a spacer 11 is formed using a resist in advance on the chip mounting surface of the mounting substrate 10 and after the resin material 12 has been supplied onto the chip mounting surface of the mounting substrate 10, the semiconductor chip 14 is mounted on the mounting substrate 10 using the pressure/heat applying head 20. By setting the thickness of the spacer 11 at a thickness where the semiconductor chip 14 is supported at a distance from the mounting substrate 10 without bonding of the connected parts of the semiconductor chip 14 and the mounting substrate 10 being obstructed and without the circuit surface of the semiconductor chip 14 being damaged, when the semiconductor chip 14 is flip-chip mounted on the mounting substrate 10, mounting can be carried out without the filler included in the resin material 12 damaging the semiconductor chip 14.

The spacer 11 is formed in a predetermined pattern by applying a resist or using a resist material formed as a film. When forming the spacer 11, it is possible to form the spacer 11 at a position that does not adversely affect the semiconductor chip 14 during mounting. By using a photosensitive resist material, the spacer 11 can be formed in a desired pattern.

Fourth Embodiment

Figure 4:
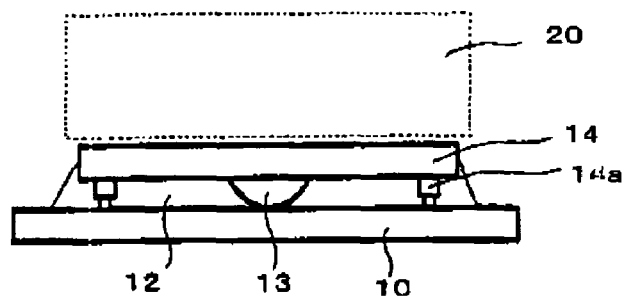
FIG. 4 is a diagram useful in explaining a fourth embodiment of a method of flip-chip mounting according to the present invention.
Figure 5A:
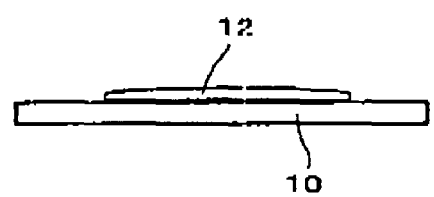
FIG. 5 is a diagram useful in explaining a conventional method of flip-chip mounting.
Figure 5B:
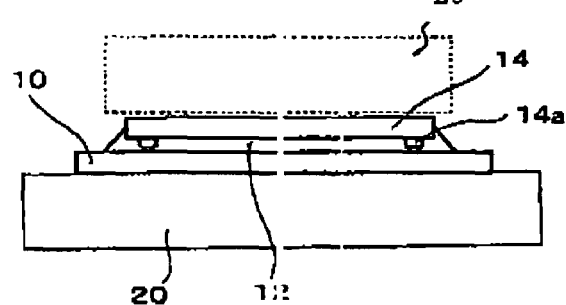
Figure 6:
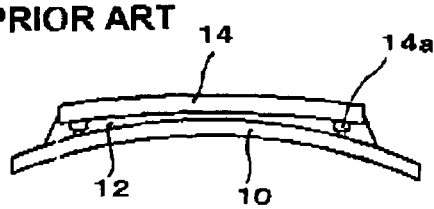
FIG. 6 is a diagram showing a state where mounting is carried out in a state where a mounting substrate is warped.

FIG. 4 shows a fourth embodiment of a method of flip-chip mounting according to the present invention. The method of flip-chip mounting according to the present embodiment is characterized by forming a spacer 13 on the circuit surface of the semiconductor chip 14, that is, a surface that faces the mounting substrate 10 when mounting is carried out, instead of forming the spacer 11 on the mounting substrate 10.

As the method of forming the spacer 13 on the circuit surface of the semiconductor chip 14, it is possible to use a method that applies a resin (an adhesive) on the circuit surface of the semiconductor chip 14 and then hardens the resin to produce the spacer 13. In the manufacturing process of the semiconductor chip 14, it is judged whether the characteristics of individually formed semiconductor chips are defective or non-defective at the semiconductor wafer-stage and marking is carried out to indicate whether the individual semiconductor chips are defective or non-defective. When marking is carried out to indicate whether the individual semiconductor chips are defective or non-defective, instead of marking, it is possible to apply the resin that forms the spacer 13 described above, with the actual spacer 13 being formed in a later process. This method is efficient in that the marking of the semiconductor chips and the formation of the spacers 13 can be carried out simultaneously.

In the same way as the spacer 11 of the third embodiment, the protruding height of the spacer 13 is set so that a predetermined gap is kept between the semiconductor chip 14 and the mounting substrate 10 without obstructing the operation that electrically connects the semiconductor chip 14 to the mounting substrate 10. In the present embodiment also, the spacer 13 is formed at a position on the circuit surface of the semiconductor chip 14 that does not adversely affect the semiconductor chip 14 after mounting.

In this way, by flip-chip mounting with a spacer 13 provided on the surface of the semiconductor chip 14 that faces the mounting substrate 10, it is possible to reliably mount the semiconductor chip 14 on the mounting substrate 10 without damaging the semiconductor chip 14.

What is claimed is:

1. A method of flip-chip mounting a semiconductor chip onto a mounting substrate, comprising the steps of:

applying a resin material to a chip mounting part of the mounting substrate;

sucking and holding the semiconductor chip by a pressure heat applying head, in which a surface for sucking the semiconductor chip is formed into a concave surface and a suction hole is opened at the center of the concave surface so as to bend the semiconductor chip upward or in a direction away from the chip mounting part of the mounting substrate;

pressing the semiconductor chip onto the mounting substrate and heating the same, by the pressure/heat applying head, in a state where the semiconductor chip is bent upward by vacuum suction from the suction hole, so as to bond bumps of the semiconductor chip to connection pads of the mounting substrate, fill a gap between the semiconductor chip and the mounting substrate with the resin material and thermally harden the resin material.

* * * * *